United States Patent [19]
Westberry

[11] 4,104,588
[45] Aug. 1, 1978

[54] TAMPER PREVENTION APPARATUS FOR WATT-HOUR METER
[76] Inventor: Wyman Westberry, St. Mary's, Ga. 31558
[21] Appl. No.: 763,360
[22] Filed: Jan. 28, 1977
[51] Int. Cl.² .................. G01R 11/24; G01R 1/04; H01R 13/20
[52] U.S. Cl. .................... 324/110; 324/156; 339/66 M; 339/184 M; 361/369
[58] Field of Search ............ 324/110, 156; 361/369, 361/370, 371; 339/66 M, 67, 184 M, 186 M, 185 R, 65

[56] References Cited
U.S. PATENT DOCUMENTS
2,135,267  11/1938  Alden ........................ 339/66 M
4,034,290   7/1977  Warren ...................... 324/110

Primary Examiner—Rudolph V. Rolinec
Assistant Examiner—Ernest F. Karlsen
Attorney, Agent, or Firm—Jones, Thomas & Askew

[57] ABSTRACT

Apparatus for attachment to watt-hour meter apparatus of the type commonly used to measure electrical power consumption, to prevent from being misinstalled so as to run the meter backwards. A first obstruction member or members are provided within the box which receives the watt-hour meter, and a second obstruction member is secured to the meter. These obstructions are asymmetrically disposed with respect to mating electrical contacts on the meter and within the meter box, so that the obstructions on the meter and in the meter box confront one another and prevent the meter from being installed in an inverted position which causes the meter to run backwards.

6 Claims, 3 Drawing Figures

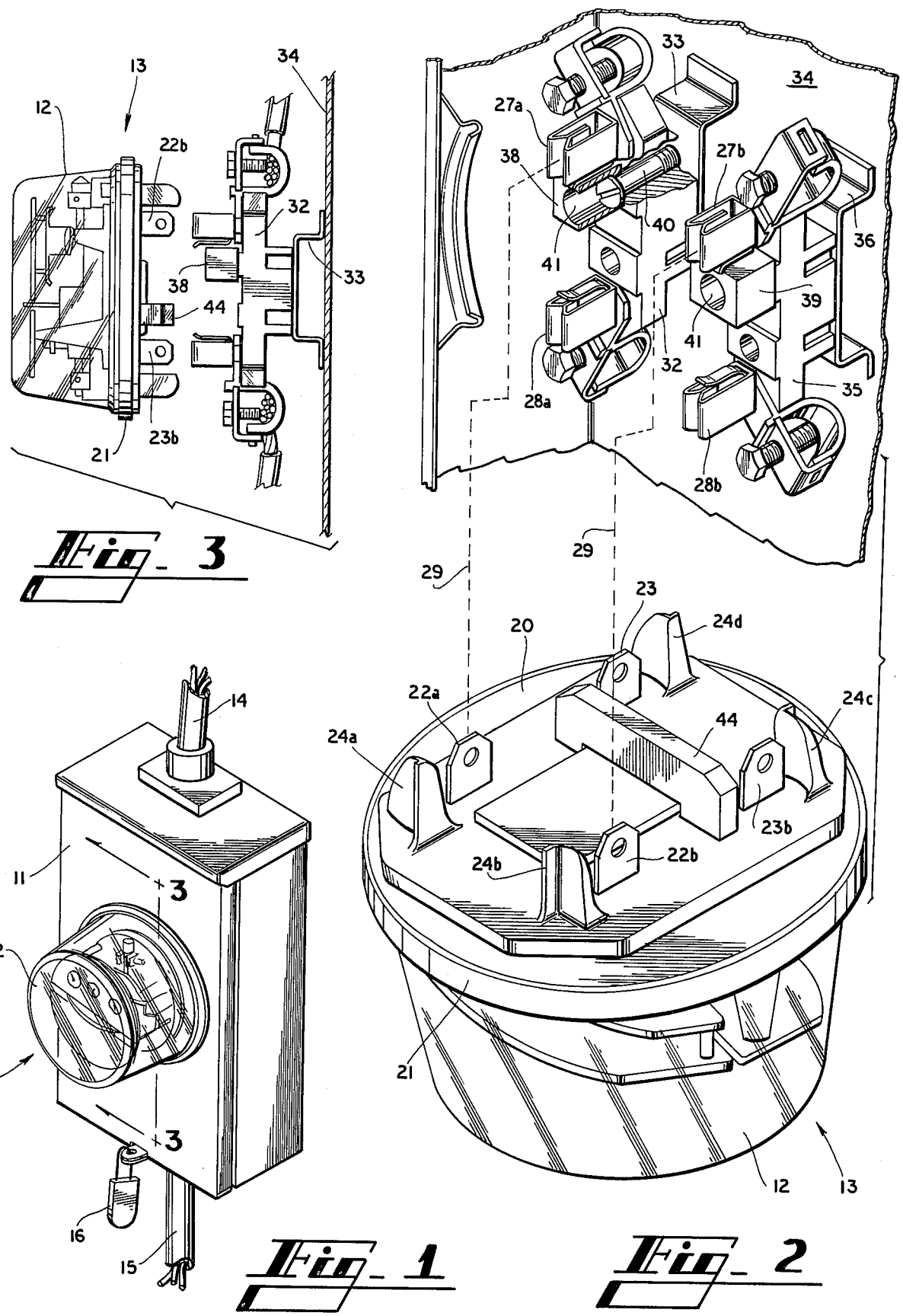

TAMPER PREVENTION APPARATUS FOR WATT-HOUR METER

This invention relates in general to apparatus for measurement of electrical power consumption, and in particular to apparatus for use with watt-hour power consumption meters to prevent theft or misappropriation of electrical power by meter tampering.

It has been recognized by some persons that the conventional watt-hour meter, widely used to measure electrical power consumption by households and other power customers, can be made to run backwards simply by installing the meter in an inverted or upside-down position. This inverted installation of power meters is a relatively simple procedure, unfortunately, since the conventional watt-hour meter plugs into a meter box by way of a symmetrical plug-socket arrangement which enables the meter to be installed either in a normal position or in an inverted position. Since watt-hour consumption meters maintain a cummulative total of kilowatt-hours of electrical power consumption, it is apparent that inverting the meter will actually cause the cumulative reading to decrease from some previously-attained maximum value. This operating characteristic of watt-hour power consumption meters has become increasingly well-known, with the result that many individuals seek to avoid paying for at least part of their electrical power consumption by inverting their meter at times during the billing period of their electrical power company.

While meter boxes for such watt-hour meters are typically provided with a security seal which must be broken before a meter can be removed and re-installed in the inverted position, the possible sanction for tampering with such seals has proved to be ineffective to prevent persons from tampering with electrical meters to unlawfully obtain electrical power which will not be indicated on their meter reading. Electrical power companies have been forced to develop expensive strategems such as computer programs which seek abnormal power usage patterns, in an effort to detect and prevent such meter tampering. It has also been proposed to provide such watt-hour meters with an "anti-reverse" feature which, when the meter is installed in the inverted position, will electrically or mechanically shift the metering mechanism so that the meter will continue to display an accumulating amount of power consumption. Such changes in meter construction are relatively costly when considered in view of the number of such meters presently in service, since either replacement meters or relatively time-consuming rebuilding of existing meters would be required.

The present invention overcomes the foregoing problems of the art by providing a watt-hour meter and meter box structure which renders such meters incapable of being installed in an inverted position. The present invention, which may be provided in the form of a kit or set of components for attachment to existing meters and meter boxes, or which may alternatively be built into meters and meter boxes of new construction, is comprised by complementary members that are on the meter and on the meter box, in position such that the complementary members interferingly contact each other to prevent the meter from being installed in the inverted position. The arrangement of the complementary obstructing members does not interfere with installing the meter in the normal or upright position. Furthermore, a meter or meter box equipped according to the present invention is use-compatible with a box or meter, respectively, which has not been so equipped.

Accordingly, it is an object of the present invention to provide anti-tamper apparatus for watt-hour meters.

It is another object of the present invention to provide apparatus which prevents a watt-hour meter from being installed in a position other than the normal operating position.

It is yet another object of the present invention to provide anti-tampering apparatus which can be readily adapted to existing watt-hour meter installations.

Other objects and advantages of the present invention will become apparent from the following discussion of a disclosed embodiment thereof, in which:

FIG. 1 shows a pictorial view of a watt-hour meter installed in a meter box;

FIG. 2 shows a pictorial view of the apparatus in FIG. 1, showing both meter and meter box equipped according to the disclosed embodiment of the present invention; and FIG. 3 shows a side elevation view taken along line 3—3 of FIG. 1, with the meter disconnected and with details of the meter box housing omitted for clarity.

Turning to FIG. 1, there is seen a meter box indicated generally at 10 and having a front panel 11 through which the outer part 12 of a typical watt-hour meter 13 protrudes. An electrical service cable 14 enters the top of the meter box, and another cable 15 exits the bottom of the box to extend to a conventional power distribution panel which forms no part of the present invention. The meter box 10 and the meter 13, although equipped according to the disclosed embodiment of the present invention, are outwardly indistinguishable from meters and meter boxes of conventional construction so long as the meter remains installed in the box as shown in FIG. 1. A conventional anti-tamper seal 16 is typically provided on the meter box 10 so that the front panel 11 of the box cannot be opened to remove or to invert the meter without breaking the seal.

Turning to FIG. 2, it can be seen that the meter 13 includes a base portion 20 which is retained within the meter box 10 out of sight, when the front panel 11 is closed. The base portion 20 is joined to the outer part 12 of the meter by structure including an annular rim 21 which prevents the meter from being withdrawn from the meter box without opening the front panel 11.

Extending rearwardly from the base portion 20 is a pair of power input contacts 22a and 22b, and a similar pair of power output contacts 23a and 23b. The input contacts 22a and 22b receive electrical current from the power line service cable 14 when the meter is properly installed within the meter box 10. The electrical current flows through the installed meter to actuate the power metering mechanism, and then flows from the output contacts 23a 23b to enter the cable 15 extending from the meter box. Each of the input contacts and the output contacts takes the shape of a spade lug, in the depicted meter 13. The base portion 20 is made of a suitable insulating material, and preferably has protective insulating fingers 24a–24d extending outwardly a short distance beyond each of the four power contacts on the meter.

The meter box 10 conventionally includes a pair of input contacts 27a and 27b which mate with the corresponding meter input contacts 22a and 22b, and a pair of power output contacts 28a and 28b which mate with the corresponding output contacts 23a and 23b on the meter. Each of the contacts 27a, 27b and 28a, 28b in the meter box is a spring-loaded member shaped to grip a respective contact lug on the meter, as the meter is plugged into the meter box along the broken lines collectively designated at 29.

The input contact 27a and the output contact 28a are rigidly supported within the meter box 10 by being mounted on a contact support 32 which is made of a suitable insulating material, and which is in turn secured by the bracket 33 to the back wall 34 of the meter box. The other two contacts 27b and 28b are similarly mounted within the meter box by being supported on another insulated contact support 35 which is secured to the back of the meter box by a similar bracket 36. It will be understood by those skilled in the art that the power contacts within the meter box, particularly the input contacts 27a and 27b, are recessed within the box behind the front panel 11.

It can also be seen, especially with respect to FIG. 2, that the input contacts 22a, 22b and the output contacts 23a, 23b of the meter 13 are located in a symmetrical pattern on the base portion 20 of the meter. The input contacts 27a, 27b and the output contacts 28a, 28b of the meter box are located in the same symmetrical pattern, as a consequence of which the meter 13 can be installed either in an upright position or in an inverted position, as aforementioned. It is the inverted position of the meter 13 within the meter box which connects the meter output contacts 23a, 23b with the power input contacts 27a, 27b of the meter box, thereby causing the meter to run backwards as electrical power flows from the service cable 14 through the meter in the reverse direction and into the output cable 15.

Turning again to FIG. 2, it is seen that each of the contact supports 32 and 35 within the meter box 10 is equipped with a separate block member 38 and 39, respectively. Although the blocks 38 and 39 may be secured to the contact supports 32 and 35 by any suitable technique, it is seen that the block 38 of the disclosed embodiment is retained in place by the bolt 40 which extends through the countersunk opening 41 in the block 38 and continues on through an existing bolt opening in the contact support 32 to connect with the bracket 33. The bolt 40 may be an elongated replacement for one of the bolts which conventionally attaches the contact support 32 to the bracket 33. It will be apparent, as an alternative attachment technique, that the blocks 38 and 39 could be adhesively secured to the respective contact supports by a suitable adhesive substance such as epoxy resin or the like. Whatever the technique for attaching the blocks 38 and 39, however, it is necessary that these blocks be asymmetrically located with respect to the electrical input and output contacts within the meter box.

Turning next to the meter 13 as shown in FIG. 2, it is seen that a bar 44 is affixed to the base portion of the meter, also in asymmetrical relation to the electrical contacts 22a, 22b and 23a, 23b extending rearwardly from the meter. The asymmetrical location of the bar 44, relative to the meter electrical contacts, is complementary to the corresponding asymmetrical relation of the meter box blocks 38 and 39 relative to the electrical contacts within the meter box. As a result, it will be seen that the bar 44 is received without physical contact or interference between the blocks 38, 39 and the output contacts 28a, 28b, when the meter 13 is plugged into the meter box in the normal upright position. It will also be seen that an attempt to install the meter in the inverted position will fail, however, because the bar 44 will contact the blocks 38, 39 and prevent the meter electrical contacts from making connection with the contacts within the meter box. Thus, the meter 13 can be installed only in the authorized upright position.

The bar 44 is most readily attached to an existing meter by a suitable adhesive such as epoxy resin or the like. It will be understood that the bar 44 should have a lower surface 45 which conforms to the particular contour of the meter base portion 20.

The disclosed embodiment of the present invention takes the form of elements which are readily adaptable to be installed or attached to an existing meter and meter box with a minimum amount of effort and expense, inasmuch as both the bar 44 and the blocks 38, 39 can be equipped at the time of manufacture with an adhesive coating which will adhere the respective members to the meter and to the meter box. The blocks and bar, or similar structure according to the present invention, can thus be readily added to existing meter installations at relatively low cost, without rebuilding or otherwise modifying the power-metering structure of the meter. It may be desirable to use only a single one of the meter box blocks 38 and 39, in combination with the meter-attached bar 44, to further reduce the cost and installation time. It will also be apparent that meters and meter boxes of new manufacture can be factory-equipped with the bar 44 and complementary meter box structure so as to prevent inverted installation of the meter. It can be seen that either a meter or meter box equipped according to the present invention is compatible with a conventional meter or meter box, although meter inversion will not be prevented unless both the meter and the meter box are so equipped.

It will also be apparent that the foregoing relates only to a disclosed preferred embodiment of the present invention, and that numerous alterations and modifications may be made therein without departing from the spirit and the scope of the invention as defined in the following claims.

I claim:

1. Apparatus for tamperproofing an electrical watthour meter, comprising:
   a meter box;
   first symmetrically disposed electrical contact means associated with said meter box;
   meter means having matching second symmetrically disposed electrical contact means which can be selectably engaged with said first contact means in either of two operative modes;
   first obstruction means separate from and securely mounted in said meter box in asymmetrical relation to said symmetrical first contact means; and
   second obstruction means separate from and securely mounted on said meter means in asymmetrical relation to said symmetrical second contact means and in relation predetermined to said first obstruction means to engage said first obstruction means and prevent engagement of said contact means in only one of said operative modes.

2. Apparatus as in claim 1, further comprising:
   electrical contact support means mounted in said meter box and supporting said symmetrical first electrical contact means; and wherein
   said first obstruction means is mounted on said contact support means in asymmetrical relation to said first electrical contact means.

3. Apparatus as in claim 2, wherein:

said meter box includes a cover having an opening through which a portion of said meter protrudes from the interior of the meter box;

said first electrical contact means are within said meter box to support said meter in alignment with said opening in said cover; and said second obstruction means is mounted on another position of said meter so as to be disposed within said meter box.

4. Apparatus for tamperproofing a conventional electrical watt-hour meter of the type which has symmetrically disposed line contacts and load contacts, and which can conventionally be engaged in either of two operative modes with a converted meter box having symmetrically disposed line contacts and load contacts, said apparatus comprising:

at least one meter box obstruction member separate from and securable within said meter box in predetermined asymmetrical relation to said contacts within the meter box; and a meter obstruction member separate from and securable to said meter in predetermined complementary asymmetrical relation to said meter contacts and in predetermined position to engage said meter box obstruction member, so as to prevent engagement of said contact means in only one of said operative modes.

5. Apparatus as in claim 1, wherein:

said first obstruction means is located in said meter box so as to avoid interfering with engagement of a meter means which lacks said second obstruction means; and said second obstruction means is located on said meter means so as to avoid interfering with engagement of a meter box which lacks said first obstruction means.

6. Apparatus as in claim 4, wherein:

said meter box obstruction member is disposed in said meter box so as to avoid interfering with engagement of a said meter which lacks said meter obstruction member; and said meter obstruction member is disposed on said meter so as to avoid interfering with engagement within a said meter box which lacks said meter box obstruction member.

* * * * *